United States Patent
Chen (10) Patent No.: US 9,953,203 B2
(45) Date of Patent: Apr. 24, 2018

(54) SLOPE WAVE GENERATION CIRCUIT AND DIGITAL-TO-ANALOG CONVERSION CIRCUIT THEREOF, FINGERPRINT IDENTIFICATION SYSTEM

(71) Applicant: SHENZHEN HUIDING TECHNOLOGY CO., LTD., Shenzhen, Guangdong (CN)

(72) Inventor: Songtao Chen, Guangdong (CN)

(73) Assignee: SHENZHEN GOODIX TECHNOLOGY CO., LTD., Shenzhen, Guangdong (CN)

(*) Notice: Subject to any disclaimer, the term of this patent is extended or adjusted under 35 U.S.C. 154(b) by 19 days.

(21) Appl. No.: 15/248,621

(22) Filed: Aug. 26, 2016

(65) Prior Publication Data
US 2016/0364598 A1  Dec. 15, 2016

Related U.S. Application Data

(63) Continuation of application No. PCT/CN2014/095016, filed on Dec. 25, 2014.

(30) Foreign Application Priority Data

Oct. 24, 2014  (CN) .......................... 2014 1 0579984

(51) Int. Cl.
G06K 9/00 (2006.01)
G06K 9/38 (2006.01)
(Continued)

(52) U.S. Cl.
CPC ............. *G06K 9/0002* (2013.01); *H03K 4/08* (2013.01); *G06K 9/38* (2013.01); *H03M 1/56* (2013.01)

(58) Field of Classification Search
None
See application file for complete search history.

(56) References Cited

U.S. PATENT DOCUMENTS 4,215,315 A * 7/1980 Lambert ................ G01R 23/00
324/76.66
5,504,463 A † 4/1996 Hwang
(Continued)

FOREIGN PATENT DOCUMENTS

CN         1318224 A      10/2001
CN       101217251 A       7/2008
(Continued)

OTHER PUBLICATIONS

State Intellectual Property Office of the P.R. China (ISR/CN), "International Search Report for PCT/CN201/095016", China, dated Apr. 28, 2015.
(Continued)

*Primary Examiner* — Howard Williams
(74) *Attorney, Agent, or Firm* — Tim Tingkang Xia, Esq.; Locke Lord LLP (57) ABSTRACT

The present disclosure, related to the technical field of fingerprint identification, discloses a ramp wave generation circuit, a digital-to-analog conversion circuit, and a fingerprint identification system. The ramp wave generation circuit comprises: an integrating circuit, configured to output a ramp wave signal; a signal regulation circuit, comprising a feedback control loop and a transconductance amplifier connected in series, wherein the feedback control loop monitors the ramp wave signal output by the integrating circuit, and outputs a regulation control signal to the transconductance amplifier, the transconductance amplifier corrects, according to the regulation control signal, a ramp wave signal output by the integrating circuit within a next period; and a voltage generation circuit, configured to
(Continued)

respectively output a reference voltage signal to the integrating circuit and the signal regulation circuit.

12 Claims, 3 Drawing Sheets

(51) Int. Cl.
*H03M 1/56* (2006.01)
*H03K 4/08* (2006.01)

(56) References Cited

U.S. PATENT DOCUMENTS

| | | |
|---|---|---|
| 6,078,151 A | 6/2000 | Kudo |
| 6,225,937 B1 * | 5/2001 | Butler ................ H03M 1/0872 341/118 |
| 7,710,306 B2 | 5/2010 | Mori |
| 7,746,129 B2 * | 6/2010 | Choi ........................ H03K 4/50 327/131 |
| 2007/0008206 A1 † | 1/2007 | Tooyama |
| 2014/0055176 A1 | 2/2014 | Zhang et al. |

FOREIGN PATENT DOCUMENTS

| | | |
|---|---|---|
| CN | 101964662 A | 2/2011 |
| CN | 103048922 A | 4/2013 |
| CN | 103810479 A | 5/2014 |
| JP | 2008124726 A | 5/2008 |
| KR | 19980080790 A | 11/1998 |

OTHER PUBLICATIONS

Linear, Polynomial and Exponential Ramp Generators with Automatic Slope Adjustment by Jansson et al., published in IEEE Transactions on Circuits and Systems-I: Fundamental Theory and Applications, vol. 41, No. 2, Feb. 1994, p. 181-185.†

* cited by examiner
† cited by third party

SLOPE WAVE GENERATION CIRCUIT AND DIGITAL-TO-ANALOG CONVERSION CIRCUIT THEREOF, FINGERPRINT IDENTIFICATION SYSTEM

CROSS-REFERENCE TO RELATED APPLICATIONS

This application is a continuation of International Patent Application No. PCT/CN2014/095016, with an international filing date of Dec. 25, 2014, designating the United States, now pending, which is based on Chinese Patent Application No. 201410579984.3, filed Oct. 24, 2014. The contents of these specifications are incorporated herein by reference.

BACKGROUND OF THE INVENTION

Field of the Invention

The present disclosure relates to fingerprint identification, and in particular, to a ramp wave generation circuit, a digital-to-analog conversion circuit, and a fingerprint identification system.

Description of the Related Art

With the advancement of the security technologies, fingerprint identification gains more and more attractions among people, which is being more and more widely used in various fields. A capacitive fingerprint sensing system is typically formed by fingerprint sensing pixel circuits, which act as basic units of the fingerprint sensing system. The pixel circuit extracts a capacitance coupling signal of each pixel point, and then inputs the signal to another part of the fingerprint sensing system for amplification, analog-to-digital conversion, image splicing and operations alike, to finally extract valid fingerprint information. In related arts, the pixel array data is read generally in the following three manners: global analog-to-digital conversion, local analog-to-digital conversion or row-column analog-to-digital conversion. In the above three manners, a digital-to-analog conversion circuit always is used. However, in the digital-to-analog conversion circuit, a ramp wave generation circuit and a clock generator are simply subjected to the influence of process/voltage/temperature (PVT), and thus the performance of the fingerprint identification system deteriorates.

SUMMARY OF THE INVENTION

An aspect of the present disclosure provides a ramp wave generation circuit, the ramp wave generation includes: an integrating circuit, configured to output a ramp wave signal; a signal regulation circuit, including a feedback control loop and a transconductance amplifier that are connected in series, wherein the feedback control loop monitors the ramp wave signal output by the integrating circuit, and outputs a regulation control signal to the transconductance amplifier such that the transconductance amplifier corrects, according to the regulation control signal, a ramp wave signal output by the integrating circuit within a next period; and a voltage generation circuit, configured to respectively output a reference voltage signal to the integrating circuit and the signal regulation circuit.

Another aspect of the present disclosure provides a fingerprint identification system, includes a digital-to-analog conversion circuit, wherein the digital-to-analog conversion circuit includes a ramp wave generation circuit as described above.

Still another aspect of the present disclosure provides a digital-to-analog conversion circuit, which includes: a ramp wave generation circuit as described above, a control circuit, a fingerprint signal/retaining circuit, a comparator, a clock generator and an N-bit counter; wherein the control circuit is configured to control the ramp wave generation circuit and the N-bit counter to simultaneously operate; the ramp wave generation circuit is configured to output a ramp wave signal to the comparator under control of the control circuit; the fingerprint signal/retaining circuit is configured to output a pixel sensing signal subjected to enhancement processing to the comparator; the comparator is configured to compare the ramp wave signal with the pixel sensing signal, output a signal to the N-bit counter, and reverse the output signal when the ramp wave signal is equal to the pixel sensing signal; and the N-bit counter is configured to start operating under control of the control circuit, and latch a counted value when the signal output by the comparator is subjected to reversal, such that an ADC (Analog to Digital Conversion) outputs a codeword signal upon conversion is obtained; and the clock generator is configured to provide timing reference to the digital-to-analog conversion circuit.

DETAILED DESCRIPTION OF THE EMBODIMENTS

To make the technical problem to be solved, technical solutions, and advantages of the present disclosure clearer and more understandable, the present disclosure is further described in detail with reference to the accompanying drawings and specific embodiments. It should be understood that the embodiments described here are only exemplary ones for illustrating the present disclosure, and are not intended to limit the present disclosure.

Figure 1:
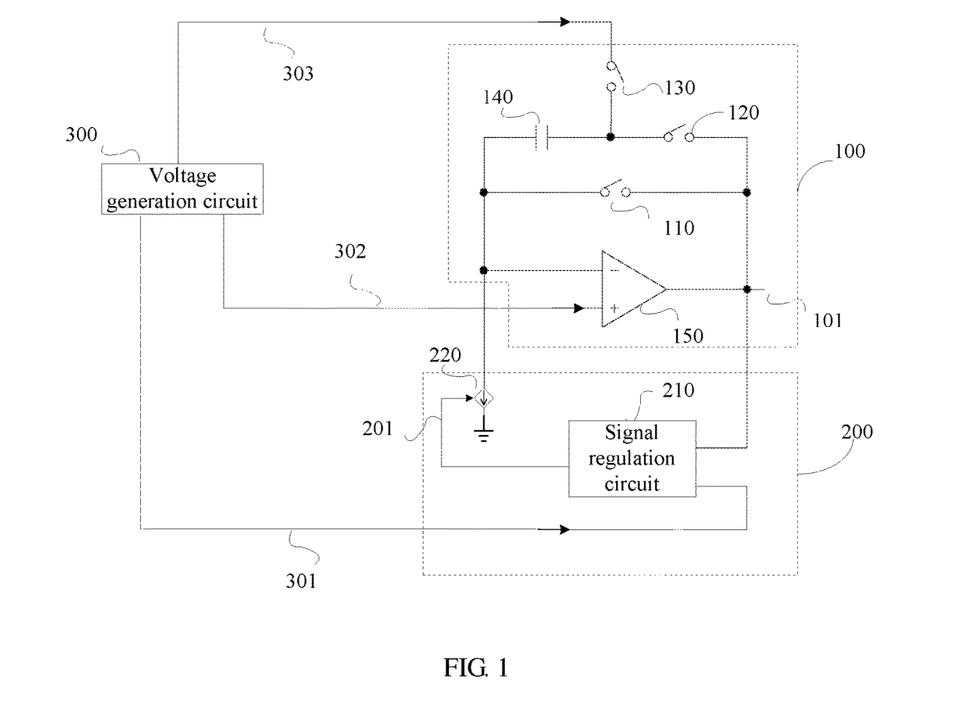
FIG. 1 is a schematic diagram of a ramp wave generation circuit according to an embodiment of the present disclosure.

The present disclosure provides a ramp wave generation circuit. Referring to FIG. 1, a ramp wave signal generated by the ramp wave generation circuit is a single-slope ramp wave signal, and the ramp wave generation circuit includes an integrating circuit 100, a signal regulation circuit 200 and a voltage generation circuit.

The integrating circuit 100 is configured to output a ramp wave signal. The integrating circuit 100 includes a first bilateral switch 110, a second bilateral switch 121, a third bilateral switch 130, a ramp wave signal generation capacitor 140 and a first high-gain operational amplifier 150. The first bilateral switch 110 is connected between a negative input and an output of the first high-gain operational amplifier 150. One terminal of the ramp wave signal generation capacitor 140 is connected to the negative input of the first high-gain operational amplifier 150, and the other terminal of the ramp wave signal generation circuit 140 is connected to the output of the first high-gain operational amplifier 150 via the second bilateral switch 120. One terminal of the third bilateral switch 130 is connected to the voltage generation circuit 300, and the other terminal of the third bilateral switch 130 is connected between the ramp wave signal generation capacitor 140 and the second bilateral switch 120. It should be noted that in the integrating circuit, the first bilateral switch 110, the second bilateral switch 120 and the third bilateral switch 130 are respectively controlled by two paths of phase-inversed and non-overlapped periodic signals, in other words, these three bilateral switches would not simultaneously operate in a conduction state.

The signal regulation circuit 200 can be formed by a feedback control loop 210 and a transconductance 220 that are connected in series. The feedback control loop 210 monitors the ramp wave signal output by the integrating circuit 100, and outputs a regulation control signal to the transconductance amplifier 220 such that the transconductance amplifier 220 corrects, according to the regulation control signal, a ramp wave signal output by the integrating circuit 100 within a next period.

The voltage generation circuit is configured to respectively output a reference voltage signal to the integrating circuit and the signal regulation circuit.

The ramp wave generation circuit follows the following working principles:

When the ramp wave generation circuit operates at an initial state, the ramp wave signal generation capacitor 140 has no charge. An output signal 301 of the voltage generation circuit 300 is marked as $V_{SET\_STOP}$, an output signal 302 of the voltage generation circuit 300 is marked as $V_{SET\_VCM}$, and an output signal 303 of the voltage generation circuit 300 is marked as $V_{SET\_START}$ obviously, each time an output ramp wave signal 101 starts rising linearly from voltage $V_{SET\_START}$.

Firstly, to clarify the key point of analysis, the operation of the ramp wave generation circuit without consideration of the impact caused by PVT is as follows:

At the normal operating stage of the ramp wave generation circuit, the feedback control loop 210 monitors a difference between an "end value", that is, a voltage $V_{RAMP\_END}$ at a highest point of the generated ramp wave signal, of the ramp wave signal 101 output by the integrating circuit 100 and the output signal 301, i.e., $V_{SET\_STOP}$, of the voltage generation circuit 300, and outputs a regulation control signal 201 to the transconductance amplifier 220, so as to correct a charge current to the ramp wave signal generation capacitor 140 which generates a ramp wave signal in a next period. By virtue of such an automatic tracking-correction mechanism, upon several output periods of the ramp wave signals, the following relationship should be satisfied:

$$V_{RAMP\_END} = V_{SET\_STOP} \quad (2)$$

Hereinafter the automatic tracking-correction mechanism may be described in detail by taking the process of generating a ramp wave signal 101 as an example.

During transmission of the ramp wave signal 101, the bilateral switch 120 is in a conduction state, whereas the bilateral switches 110 and 130 are in a cut-off state. The transconductance amplifier 220 constantly outputs a stable charging current under control of the regulation control signal 201 output by the feedback control loop 210, such that the voltage at two ends of the ramp wave signal generation capacitor 140 rises. Assuming that upon the "tracking-correction" process within a previous period, a variation of the current output by the transconductance amplifier 220 is $\Delta I$, then the following equation is established:

$$\Delta I = g_m * \Delta V_{error} \quad (3)$$

In the equation (3), gin represents a transconductance of the transconductance amplifier 220, $\Delta V_{error}$ represents, when the previous ramp wave output stage ends, a difference between $V_{RAMP\_END}$ and a predetermined value $V_{SET\_STOP}$.

In addition, it is assumed that the capacitance of the ramp wave signal generation capacitor 140 is $C_R$ and the duration of the ramp wave generation stage is $T_{RAMP}$, then:

$$V_{RAMP\_END} - V_{SET\_START} = I * \frac{T_{RAMP}}{C_R} \quad (4)$$

When the ramp wave generation stage within this period ends, if the difference between $V_{RAMP\_END}$ and the predetermined value $V_{SET\_STOP}$ is not 0, that is, the equation (2) is not established, in the equation (3) $\Delta V_{error} \neq 0$, that is, $\Delta I \neq 0$. Therefore, at the ramp wave output stage within a next period, the following equation is established $$V_{RAMP\_END} - V_{SET\_START} = \left( (I + \Delta I) * \frac{T_{RAMP}}{C_R} \right) \quad (5)$$

Upon several contiguous periods, if $\Delta V_{error}$ is sufficiently small, the equation (2) may be established, that is, the ramp wave generation circuit in FIG. 1 may output a ramp wave signal having a precise and stable amplitude.

Based on the above analysis, the impacts caused by the changes of PVT onto the performance of the ramp wave generation circuit are analyzed. For brevity, each time, the impacts caused by the changes of PVT to one single aspect are considered.

1) Changes of PVT cause changes of the output current I of the transconductance amplifier 317.

According to the equation (4), when the changes of PVT cause the output current I of the transconductance amplifier 220 to become greater, since the capacitance $C_R$ of the ramp wave signal generation capacitor 140 and the duration $T_{RAMP}$ of the ramp wave generation stage are not changed, then $\Delta V_{error} = V_{RAMP\_END} - V_{SET\_STOP}$ will become greater, that is, it is probable that $V_{RAMP\_END} > V_{SET\_STOP}$.

According to the equation (3), under effect of a negative feedback mechanism, the feedback control loop 210 may reduce the output current of the transconductance amplifier 220, such that when the next period ends $\Delta V_{error}$ is reduced. It may be foreseen that upon several contiguous periods, the equation (2) would be definitely established.

2) Changes of PVT cause changes of the capacitance $C_R$ of the capacitor 310.

According to the equation (4), when the changes of PVT cause the capacitance $C_R$ of the ramp wave signal generation capacitor 140 to become greater, since the output current I of the transconductance amplifier 220 and the duration $T_{RAMP}$ of the ramp wave generation stage are not changed, then $\Delta V_{error} = V_{RAMP\_END} - V_{SET\_STOP}$ will become greater, that is, it is probable that $V_{RAMP\_END} < V_{SET\_STOP}$.

According to the equation (3), under effect of the negative feedback mechanism, the feedback control loop 210 may increase the output current of the transconductance amplifier 220, such that when the next period ends $\Delta V_{error}$ is reduced.

It may be foreseen that upon several contiguous periods, the equation (2) would be definitely established.

3) Changes of PVT cause changes of the system clock frequency $F_{CLK}$.

According to the equation (4), when the changes of PVT cause the system clock frequency $F_{CLK}$ to become greater, the duration of the ramp wave generation stage $T_{RAMP}=N*T_{CLK}$ is reduced; since the capacitance $C_R$ of the ramp wave signal generation capacitor 140 and the output current I of the transconductance amplifier 220 are not changed, then $\Delta V_{error}=V_{RAMP\_END}-V_{SET\_STOP}$ will become smaller, that is, it is probable that $V_{RAMP\_END}<V_{SET\_STOP}$.

According to the equation (3), under effect of the negative feedback mechanism, the feedback control loop 210 may increase the output current of the transconductance amplifier 220, such that when the next period ends, $\Delta V_{error}$ is reduced. It may be foreseen that upon several contiguous periods, the equation (2) would be definitely established.

As seen from the analysis on the impacts caused by the changes of PVT to various aspects, when the changes of PVT cause a fluctuation of the circuit parameters, the ramp wave generation circuit in FIG. 1 constantly outputs a ramp wave signal having a stable and precise amplitude, that is, the amplitude $\Delta V_{RAMP}$ of generated ramp wave signal is irrelevant to the changes of PVT.

Figure 2:
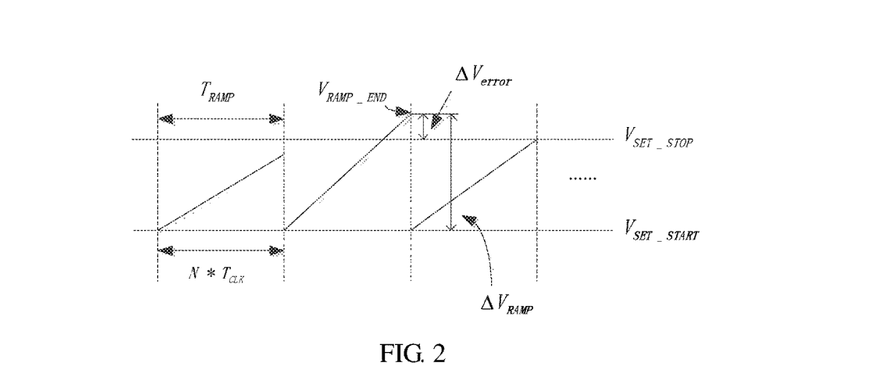
FIG. 2 is a schematic diagram illustrating an automatic tracking-correction mechanism within a duration at a plurality of ramp wave generation stages of the ramp wave generation circuit shown in FIG. 1.

Still referring to FIG. 2, a schematic diagram illustrates an automatic tracking-correction mechanism within a plurality of ramp wave generation stages when the ramp wave generation circuit according to this embodiment is applied to the single-slope ramp ADC circuit (the ramp wave digital-to-analog conversion circuit) of the fingerprint identification system.

In FIG. 2, $\Delta V_{error}=V_{RAMP\_END}-V_{SET\_STOP}$; and $\Delta V_{RAMP}=V_{RAMP\_END}-V_{SET\_START}$ represents a voltage amplitude of the output ramp wave signal 101; and $T_{RAMP}=N*T_{CLK}$, wherein $T_{CLK}$ represents the duration of each period of the system clock generator.

Therefore, the equation (4) may be rewritten as follows:

$$\Delta V_{RAMP} = V_{RAMP\_END} - V_{SET\_START} = I * \frac{N * T_{CLK}}{C_R} \quad (4a)$$

Figure 3:
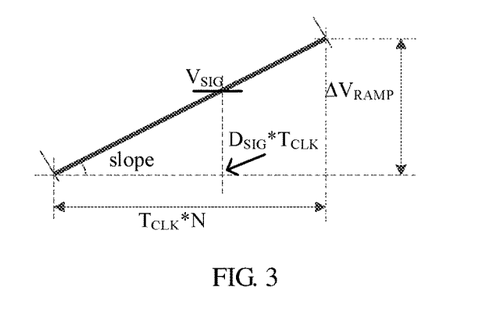
FIG. 3 is a diagram illustrating principles of a single-slope ramp ADC.

Referring to FIG. 3, it may be known according to the diagram of the single-slope ADC that:

$$slope_{RAMP} = \frac{\Delta V_{RAMP}}{N * T_{CLK}} = \frac{V_{SIG}}{D_{SIG} * T_{CLK}} \quad (5)$$

$V_{SIG}$ represents an analog voltage input to the single-slope ramp ADC circuit, and $D_{SIG}D_{SIG}$ represents a corresponding quantized output codeword.

As seen from the equation (5), for the analog voltage input to the single-slope ramp ADC circuit, the corresponding quantized output codeword should be:

$$D_{SIG} = \frac{V_{SIG}/T_{CLK}}{slope_{RAMP}} = \frac{V_{SIG}}{\frac{\Delta V_{RAMP}}{N}} = \frac{V_{SIG}}{\Delta V_{RAMP}} * N \quad (6)$$

When the changes of PVT cause the fluctuation of the circuit parameters, the circuit in FIG. 1 constantly outputs a ramp wave signal having a stable and precise amplitude, that is, the amplitude $\Delta V_{RAMP}$ of the generated ramp wave signal is irrelevant to the changes of PVT. In addition, in combination with the equation (6), the performance of the single-slope ramp ADC using the ramp wave generation circuit in FIG. 1 is also irrelevant to the changes of PVT.

Figure 4:
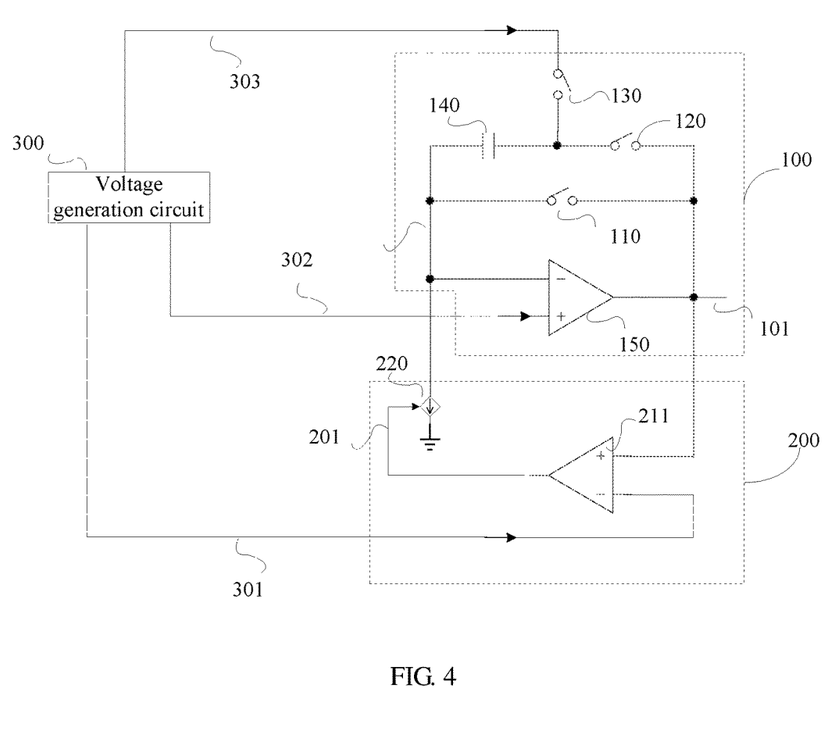
FIG. 4 is a schematic diagram illustrating a ramp wave generation circuit when a feedback control loop in FIG. 1 is formed by an error amplifier.

It should be noted that, in practical applications, the feedback control loop 210 of the signal regulation circuit 200 may be formed by a single error amplifier 211. Referring to FIG. 4, a positive input of the error amplifier 211 is connected to a ramp wave signal output of the integrating circuit, and a negative input of the error amplifier 211 is connected to the voltage generation circuit, and an output of the error amplifier 211 is connected to the transconductance amplifier.

According to the ramp wave generation circuit provided by this embodiment, the signal regulation circuit is arranged, a ramp wave signal generated by the integrating circuit is monitored by using the feedback control loop in the signal regulation circuit, and then a regulation control signal is output to the transconductance amplifier to correct a ramp wave signal output by the integrating circuit within a next period. Therefore, a voltage at the highest point of the output ramp wave signal can be automatically regulated, such that the amplitude of the output ramp wave signal is irrelevant to the changes of PVT, thereby eliminating the impacts caused by PVT. In addition, the circuit is simply practiced, which imposes no requirement on the material of the capacitor, and thus reduces the manufacture cost. Further, when the circuit is applied to the fingerprint identification system, the circuit is capable of self-adapting to the changes of the clock frequency of the system. When the clock frequency changes, the change of the slope of the ramp wave signal causes no impact on such performance indicators as single-slope ramp ADC gain error, resolution, integral non-linearity (INL) and differential non-linearity (DNL) and the like.

Figure 5:
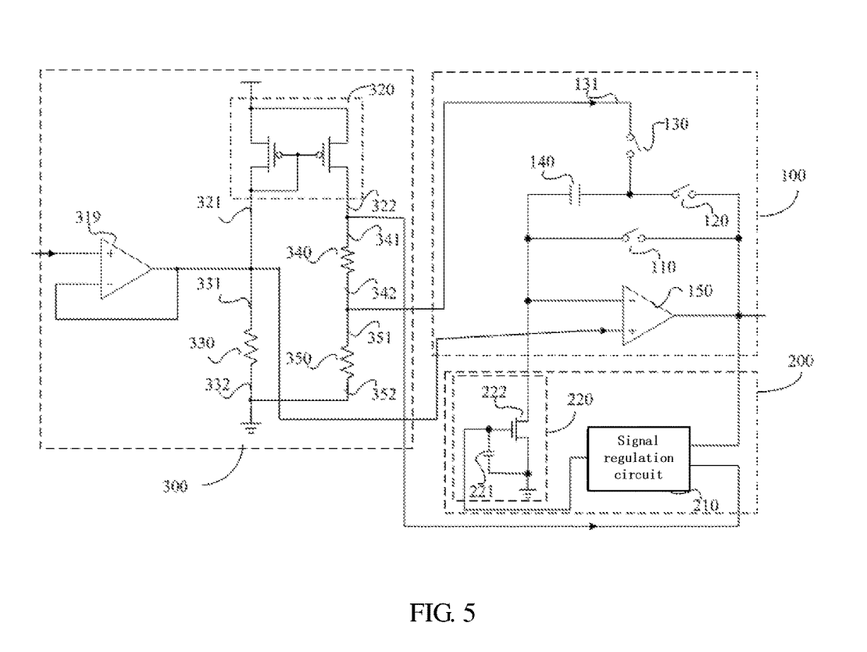
FIG. 5 is a schematic diagram of a ramp wave generation circuit according to another embodiment of the present disclosure.

Based on the above embodiments, the following embodiment provides another ramp wave generation circuit. Referring to FIG. 5, the ramp wave generation circuit includes an integrating circuit 100, a signal regulation circuit 200 and a voltage generation circuit.

The integrating circuit 100 is configured to output a ramp wave signal. The integrating circuit 100 includes a first bilateral switch 110, a second bilateral switch 121, a third bilateral switch 130, a ramp wave signal generation capacitor 140 and a first high-gain operational amplifier 150. The first bilateral switch 110 is connected between a negative input and an output of the first high-gain operational amplifier 150. One terminal of the ramp wave signal generation capacitor 140 is connected to the negative input of the first high-gain operational amplifier 150, and the other terminal of the ramp wave signal generation capacitor 140 is connected to the output of the first high-gain operational amplifier 150 via the second bilateral switch 120. A first terminal 131 of the third bilateral switch 130 is connected to a first connection terminal 351 of a third matching resistor 350 of a voltage generation circuit 300, and the other connection terminal of the third bilateral switch 130 is connected between the ramp wave signal generation capacitor 140 and the second bilateral switch 120. It should be noted that in the integrating circuit, the first bilateral switch 110, the second bilateral switch 120 and the third bilateral switch 130 are respectively controlled by two paths of phase-inversed and non-overlapped periodic signals, that is, these three bilateral switches could not simultaneously in a conduction state.

The signal regulation circuit is formed by a feedback control loop 210 and a transconductance 220 that are connected in series. The feedback control loop 210 monitors the ramp wave signal output by the integrating circuit 100, and outputs a regulation control signal to the transconductance amplifier 220 such that the transconductance amplifier 220 corrects, according to the regulation control signal, a ramp wave signal output by the integrating circuit 100 within a next period. The transconductance amplifier 220 includes an error retaining capacitor 221 and an NMOS transistor 222. A gate of the NMOS transistor 222 is connected to an output of the feedback control loop 210, and one of the remaining two terminals is connected to the ground and the other one is connected to the negative input of the first high-gain operational amplifier 150 of the integrating circuit 100 to provide an error correction current for the integrating circuit 100. An error correction current provided by the NMOS transistor 222 is determined by the feedback control circuit 210.

The voltage generation circuit 300 is configured to respectively output a reference voltage signal to the integrating circuit and the signal regulation circuit. The voltage generation circuit 300 includes a second high-gain operational amplifier 310, a current mirror circuit 320, a first matching resistor 330, a second matching resistor 340 and a third matching resistor 350.

The current mirror circuit 320 is formed by two PMOS transistors that are connected in a current mirror manner; wherein a first connection terminal 321 of the current mirror circuit 320 is connected to an output of the second high-gain operational amplifier 310, a first connection terminal 331 of the first matching resistor 330 is connected to a positive input of the first high-gain operational amplifier 150 of the integrating circuit 100, and a second connection terminal 322 of the first matching resistor 330 is connected to a first connection terminal 341 of the second matching resistor 340 and a voltage input terminal of the signal regulation circuit 210; a first connection terminal 351 of the third matching resistor 350 is connected to a second connection terminal 342 of the second matching resistor and a first connection terminal 131 of the third bilateral switch 130 of the integrating circuit 100, and a second connection terminal 352 of the third matching resistor 350 is connected to a second connection terminal 332 of the first matching resistor 330 and is grounded; and a negative input of the second high-gain operational amplifier 310 is connected to an output of the second high-gain operational amplifier 310.

The principles for eliminating the impacts caused by PVT in the ramp wave generation circuit according to this embodiment are the same as those described in the above embodiments, which are thus not described herein any further.

According to this embodiment, the signal regulation circuit is arranged in the ramp circuit generation circuit, a ramp wave signal generated by the integrating circuit is monitored by using the feedback control loop in the signal regulation circuit, and then a regulation control signal is output to the transconductance amplifier to correct a ramp wave signal output by the integrating circuit within a next period. Therefore, a voltage at the highest point of the output ramp wave signal is automatically regulated, such that the amplitude of the output ramp wave signal is irrelevant to the changes of PVT, thereby eliminating the impacts caused by PVT. In addition, three matching resistors are arranged in the voltage generation circuit, and when the proportion of the matching resistors is changed, the amplitude of a reference voltage may be flexibly changed in a great range.

Figure 6:
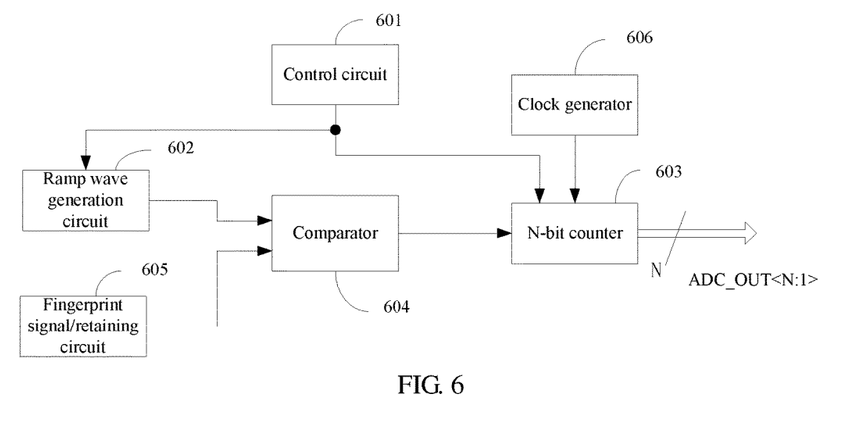
FIG. 6 is a schematic diagram of a digital-to-analog conversion circuit according to an embodiment of the present disclosure.

Based on the above two embodiments, the present disclosure further provides a fingerprint identification system, wherein the system includes a digital-to-analog conversion circuit, configured to perform a digital-to-analog conversion for the signal acquired by a fingerprint sensing pixel circuit. Referring to FIG. 6, the digital-to-analog conversion circuit includes:

a control circuit 601, configured to control a ramp wave generation circuit 602 and an N-bit counter to start to operate simultaneously;

a ramp wave generation circuit 602, configured to output a ramp wave signal to a comparator 604 under control of the control circuit 601, wherein the ramp wave generation circuit 602 may employ any one of those described in the above embodiments;

a fingerprint signal/retaining circuit 605, configured to output a pixel sensing signal subjected to enhancement processing to the comparator 604;

the comparator 604, configured to compare the ramp wave signal with the pixel sensing signal, output a signal to the N-bit counter 603, and reverse the output signal when the ramp wave signal is equal to the pixel sensing signal; and the N-bit counter 603, configured to start operating under control of the control circuit 601, and latch a counted value when the signal output by the comparator 604 is reversed, such that an ADC output codeword signal ADC_OUT<N:1> upon conversion is obtained;

a clock generator 606, configured to provide a timing reference for the digital-to-analog conversion circuit.

In the fingerprint identification system according to this embodiment, the signal regulation circuit is arranged in the ramp circuit generation circuit, a ramp wave signal generated by the integrating circuit is monitored by using the feedback control loop in the signal regulation circuit, and then a regulation control signal is output to the transconductance amplifier to correct a ramp wave signal output by the integrating circuit within a next period. Therefore, stability of the ramp wave signal generated by the integrating circuit is ensured, and the impacts caused by PVT are eliminated.

The preferred embodiments of the present disclosure are described with reference to the accompanying drawings, but the scope of the present disclosure is not limited to such embodiments. Any modification, equivalent replacement and improvement made by a person skilled in the art without departing from the scope and essence of the present disclosure shall all fall within the scope defined by the claims of the present disclosure.

INDUSTRIAL PRACTICABILITY

In the ramp wave generation circuit and the digital-to-analog conversion circuit thereof, and the fingerprint identification system according to the present disclosure, the signal regulation circuit is arranged in the ramp circuit generation circuit, and a ramp wave signal generated by the integrating circuit is monitored by using the feedback control loop in the signal regulation circuit, and then a regulation control signal is output to the transconductance amplifier tcorrect a ramp wave signal output by the integrating circuit within a next period. Therefore, a voltage at the highest point of the output ramp wave signal is automatically regulated, such that the amplitude of the output ramp wave signal is irrelevant to the changes of PVT, thereby eliminating the impacts caused by PVT. In addition, the circuit is simply practiced, which imposes no requirement on the material of the capacitor, and thus reduces the manufacture cost. Further, when the circuit is applied to the fingerprint identification system, the circuit is capable of self-adapting to the changes of the clock frequency of the system. When the clock frequency changes, the change of the slope of the ramp wave signal causes no impact on such performance indicators as single-slope ramp ADC gain error, resolution, integral non-linearity (INL) and differential non-linearity (DNL) and the like.

What is claimed is:

1. A ramp wave generation circuit, comprising:
   an integrating circuit, configured to output a ramp wave signal;
   a signal regulation circuit, comprising a feedback control loop and a transconductance amplifier connected in series, wherein the feedback control loop is configured to monitor the ramp wave signal, and output a regulation control signal to the transconductance amplifier, and the transconductance amplifier is configured to correct, according to the regulation control signal, a ramp wave signal output by the integrating circuit within a next period; and
   a voltage generation circuit, configured to respectively output a reference voltage signal to the integrating circuit and the signal regulation circuit;
   wherein the feedback control loop comprises an error amplifier, wherein a positive input of the error amplifier is connected to a ramp wave signal output of the integrating circuit, a negative input of the error amplifier is connected to the voltage generation circuit, and an output of the error amplifier is connected to the transconductance amplifier.

2. The ramp wave generation circuit according to claim 1, wherein the integrating circuit comprises a first bilateral switch, a second bilateral switch, a third bilateral switch, a ramp wave signal generation capacitor and a first high-gain operational amplifier; wherein
   the first bilateral switch is connected between a negative input and an output of the first high-gain operational amplifier;
   one terminal of the ramp wave signal generation capacitor is connected to the negative input of the first high-gain operational amplifier, and the other terminal of the ramp wave signal generation circuit is connected to the output of the first high-gain operational amplifier via the second bilateral switch; and
   one terminal of the third bilateral switch is connected to the voltage generation circuit, and the other terminal of the third bilateral switch is connected between the ramp wave signal generation capacitor and the second bilateral switch.

3. The ramp wave generation circuit according to claim 2, wherein the first bilateral switch, the second bilateral switch and the third bilateral switch are respectively controlled by two paths of phase-reverse and non-overlapped periodic signals.

4. The ramp wave generation circuit according to claim 2, wherein the transconductance amplifier comprises an error retaining capacitor and an NMOS transistor, wherein a gate of the NMOS transistor is connected to an output of the feedback control loop, one of the remaining two terminals of the NMOS transistor is connected to the ground, and the other of the remaining two terminals is connected to the negative input of the first high-gain operational amplifier of the integrating circuit to provide an error correction current for the integrating circuit.

5. The ramp wave generation circuit according to claim 1, wherein the voltage generation circuit comprises a second high-gain operational amplifier, a current mirror circuit, a first matching resistor, a second matching resistor and a third matching resistor; wherein the current mirror circuit is formed by two PMOS transistors that are connected in a current mirror manner, wherein a first connection terminal of the current mirror circuit is connected to an output of the second high-gain operational amplifier, a first connection terminal of the first matching resistor is connected to a positive input of the first high-gain operational amplifier of the integrating circuit, and a second connection terminal of the first matching resistor is connected to a first connection terminal of the second matching resistor and a voltage input terminal of the signal regulation circuit;
a first connection terminal of the third matching resistor is connected to a second connection terminal of the second matching resistor and a first connection terminal of the third bilateral switch of the integrating circuit, and a second connection terminal of the third matching resistor is connected to a second connection terminal of the first matching resistor and is grounded; and
a negative input of the second high-gain operational amplifier is connected to an output of the second high-gain operational amplifier.

6. A fingerprint identification system, comprising a digital-to-analog conversion circuit, wherein the digital-to-analog conversion circuit comprises a ramp wave generation circuit, and the ramp wave generation circuit comprises:
   an integrating circuit, configured to output a ramp wave signal;
   a signal regulation circuit, comprising a feedback control loop and a transconductance amplifier connected in series, wherein the feedback control loop is configured to monitor the ramp wave signal output by the integrating circuit, and output a regulation control signal to the transconductance amplifier; the transconductance amplifier is configured to correct, according to the regulation control signal, a ramp wave signal output by the integrating circuit within a next period; and
   a voltage generation circuit, configured to respectively output a reference voltage signal to the integrating circuit and the signal regulation circuit;
   wherein the feedback control loop comprises an error amplifier, wherein a positive input of the error amplifier is connected to a ramp wave signal output of the integrating circuit, a negative input of the error amplifier is connected to the voltage generation circuit, and an output of the error amplifier is connected to the transconductance amplifier.

7. The fingerprint identification system according to claim 6, wherein the integrating circuit comprises a first bilateral switch, a second bilateral switch, a third bilateral switch, a ramp wave signal generation capacitor and a first high-gain operational amplifier; wherein
   the first bilateral switch is connected between a negative input and an output of the first high-gain operational amplifier;
   one terminal of the ramp wave signal generation capacitor is connected to the negative input of the first high-gain operational amplifier, and the other terminal of the ramp wave signal generation circuit is connected to the output of the first high-gain operational amplifier via the second bilateral switch; and
   one terminal of the third bilateral switch is connected to the voltage generation circuit, and the other terminal of the third bilateral switch is connected between the ramp wave signal generation capacitor and the second bilateral switch.

8. The fingerprint identification system according to claim 7, wherein the first bilateral switch, the second bilateral switch and the third bilateral switch are respectively controlled by two paths of phase-reverse and non-overlapped periodic signals.

9. The fingerprint identification system according to claim 7, wherein the transconductance amplifier comprises an error retaining capacitor and an NMOS transistor, wherein a gate of the NMOS transistor is connected to an output of the feedback control loop, one of the remaining two terminals of the NMOS transistor is connected to the ground, and the other of the remaining two terminals is connected to the negative input of the first high-gain operational amplifier of the integrating circuit to provide an error correction current for the integrating circuit.

10. The fingerprint system according to claim 6, wherein the voltage generation circuit comprises a second high-gain operational amplifier, a current mirror circuit, a first matching resistor, a second matching resistor and a third matching resistor; wherein the current mirror circuit is formed by two PMOS transistors that are connected in a current mirror manner, wherein a first connection terminal of the current mirror circuit is connected to an output of the second high-gain operational amplifier, a first connection terminal of the first matching resistor is connected to a positive input of the first high-gain operational amplifier of the integrating circuit, and a second connection terminal of the first matching resistor is connected to a first connection terminal of the second matching resistor and a voltage input terminal of the signal regulation circuit;

a first connection terminal of the third matching resistor is connected to a second connection terminal of the second matching resistor and a first connection terminal of the third bilateral switch of the integrating circuit, and a second connection terminal of the third matching resistor is connected to a second connection terminal of the first matching resistor and is grounded; and a negative input of the second high-gain operational amplifier is connected to an output of the second high-gain operational amplifier.

11. An analog-to-digital conversion circuit, comprising: a ramp wave generation circuit, a control circuit, a fingerprint signal/retaining circuit, a comparator, a clock generator and an N-bit counter; wherein the control circuit is configured to control the ramp wave generation circuit and the N-bit counter to simultaneously operate;

the ramp wave generation circuit is configured to output a ramp wave signal to the comparator under control of the control circuit;

the fingerprint signal/retaining circuit is configured to output a pixel sensing signal after enhancement processing to the comparator;

the comparator is configured to compare the ramp wave signal with the pixel sensing signal, output a signal to the N-bit counter, and reverse the output signal when the ramp wave signal is equal to the pixel sensing signal;

the N-bit counter is configured to start operating under control of the control circuit, and latch a counted value when the signal output by the comparator is subjected to reversal, such that an ADC output codeword signal upon conversion is obtained; and the clock generator is configured to provide a timing reference for the digital-to-analog conversion circuit;

wherein the feedback control loop comprises an error amplifier, wherein a positive input of the error amplifier is connected to a ramp wave signal output of the integrating circuit, a negative input of the error amplifier is connected to the voltage generation circuit, and an output of the error amplifier is connected to the transconductance amplifier.

12. The analog-to-digital conversion circuit according to claim 11, wherein the ramp wave generation circuit comprises:

an integrating circuit, configured to output a ramp wave signal;

a signal regulation circuit, comprising a feedback control loop and a transconductance amplifier connected in series, wherein the feedback control loop is configured to monitor the ramp wave signal output by the integrating circuit, and output a regulation control signal to the transconductance amplifier; the transconductance amplifier is configured to correct, according to the regulation control signal, a ramp wave signal output by the integrating circuit within a next period; and a voltage generation circuit, configured to respectively output a reference voltage signal to the integrating circuit and the signal regulation circuit.

* * * * *